United States Patent
Digiacobbe et al.

(10) Patent No.: US 9,336,627 B2
(45) Date of Patent: May 10, 2016

(54) CREATING A MODEL OF A SCANNED SURFACE FOR COMPARISON TO A REFERENCE-SURFACE MODEL

(71) Applicant: HNTB HOLDINGS LTD., Kansas City, MO (US)

(72) Inventors: Paul James Digiacobbe, Ridley Park, PA (US); Christopher Michael Siebern, Lafayette, IN (US)

(73) Assignee: HNTB HOLDINGS LTD., Kansas City, MO (US)

( * ) Notice: Subject to any disclaimer, the term of this patent is extended or adjusted under 35 U.S.C. 154(b) by 551 days.

(21) Appl. No.: 13/793,700

(22) Filed: Mar. 11, 2013

(65) Prior Publication Data

US 2013/0238305 A1    Sep. 12, 2013

Related U.S. Application Data

(60) Provisional application No. 61/609,651, filed on Mar. 12, 2012.

(51) Int. Cl.
| | |
|---|---|
| G06F 17/50 | (2006.01) |
| G06T 17/05 | (2011.01) |
| G01S 13/89 | (2006.01) |

(52) U.S. Cl.
CPC ............... G06T 17/05 (2013.01); G01S 13/89 (2013.01); G06F 17/5009 (2013.01)

(58) Field of Classification Search
USPC .......................................... 703/2, 6; 701/408
See application file for complete search history.

(56) References Cited

U.S. PATENT DOCUMENTS

| | | | |
|---|---|---|---|
| 5,631,658 A | 5/1997 | Gudat et al. | |
| 7,043,057 B2 * | 5/2006 | Retterath. | G01N 21/55 359/627 |
| 8,306,747 B1 * | 11/2012 | Gagarin | G01C 7/04 701/408 |
| 2005/0099637 A1 | 5/2005 | Kacyra et al. | |
| 2011/0106339 A1 | 5/2011 | Phillips et al. | |

FOREIGN PATENT DOCUMENTS

WO    WO 2006027339    3/2006

OTHER PUBLICATIONS

International Search Report for PCT/US2013/030500, mailed May 28, 2013.
International Preliminary Report on Patentability dated Sep. 16, 2014 in Application No. PCT/US2013/030500, 9 pages.

* cited by examiner

*Primary Examiner* — Thai Phan
(74) *Attorney, Agent, or Firm* — Shook, Hardy & Bacon L.L.P.

(57) ABSTRACT

Generating a scanned-surface model representing a scanned surface includes various steps. For example, instrument model coordinates may be obtained that represent a position of the instrument in the 3D model. In addition, surface-distance measurements may be derived describing a distance from the scanned surface. Inertial measurements are also recorded. The instrument model coordinates, surface-distance measurements, and inertial measurements are correlated and filtered by a rules based selection process to determine scanned-surface model coordinates.

20 Claims, 4 Drawing Sheets

CREATING A MODEL OF A SCANNED SURFACE FOR COMPARISON TO A REFERENCE-SURFACE MODEL

CROSS-REFERENCE TO RELATED APPLICATIONS

This application claims the benefit of U.S. Provisional Application No. 61/609,651, filed Mar. 12, 2012, which is incorporated herein by reference in its entirety.

SUMMARY

A high-level overview of various aspects of the invention is outlined here to provide an overview of the disclosure and to introduce a selection of concepts, which are further described in the detailed-description section below. This summary is not intended to identify key or essential features of the claimed subject matter, nor is its intent to be used as an aid in isolation to determine the scope of the claimed subject matter.

In brief and at a high level, this disclosure describes, among other things, sampling a surface by scanning, and creating a model (e.g., mathematical, geometrical, graphical, etc.) from the scanned surface that may be compared to a reference-surface model.

BRIEF DESCRIPTION OF THE SEVERAL VIEWS OF THE DRAWINGS

Illustrative embodiments of the present invention are described in detail below with reference to the attached drawing figures, which are incorporated herein by reference, wherein.

DETAILED DESCRIPTION

The subject matter of select embodiments of the present invention is described with specificity herein to meet statutory requirements. But the description itself is not intended to define what is regarded as our invention, which is what the claims do. The claimed subject matter might be embodied in other ways to include different steps or combinations of steps similar to the ones described in this document, in conjunction with other present or future technologies. Terms should not be interpreted as implying any particular order among or between various steps herein disclosed unless and except when the order of individual steps is explicitly required.

Generally, embodiments of the present invention are directed to creating a digital model of a surface. For example, a model may include a graphical three-dimensional (3D) model of a surface, as well as coordinate frames that define the 3D spaces, such that a model may be mathematical, geometrical, graphical, etc. Surfaces may include a variety of different features, such as ground features (e.g., paved roads, graded soil, ungraded earth, etc.) or structural features (e.g., building sides, vegetation, etc.). Once a model has been created, the model may be analyzed in various ways. For example, the model may be compared to other models (e.g., a reference-surface model) to identify differences between the models.

Figure 1:
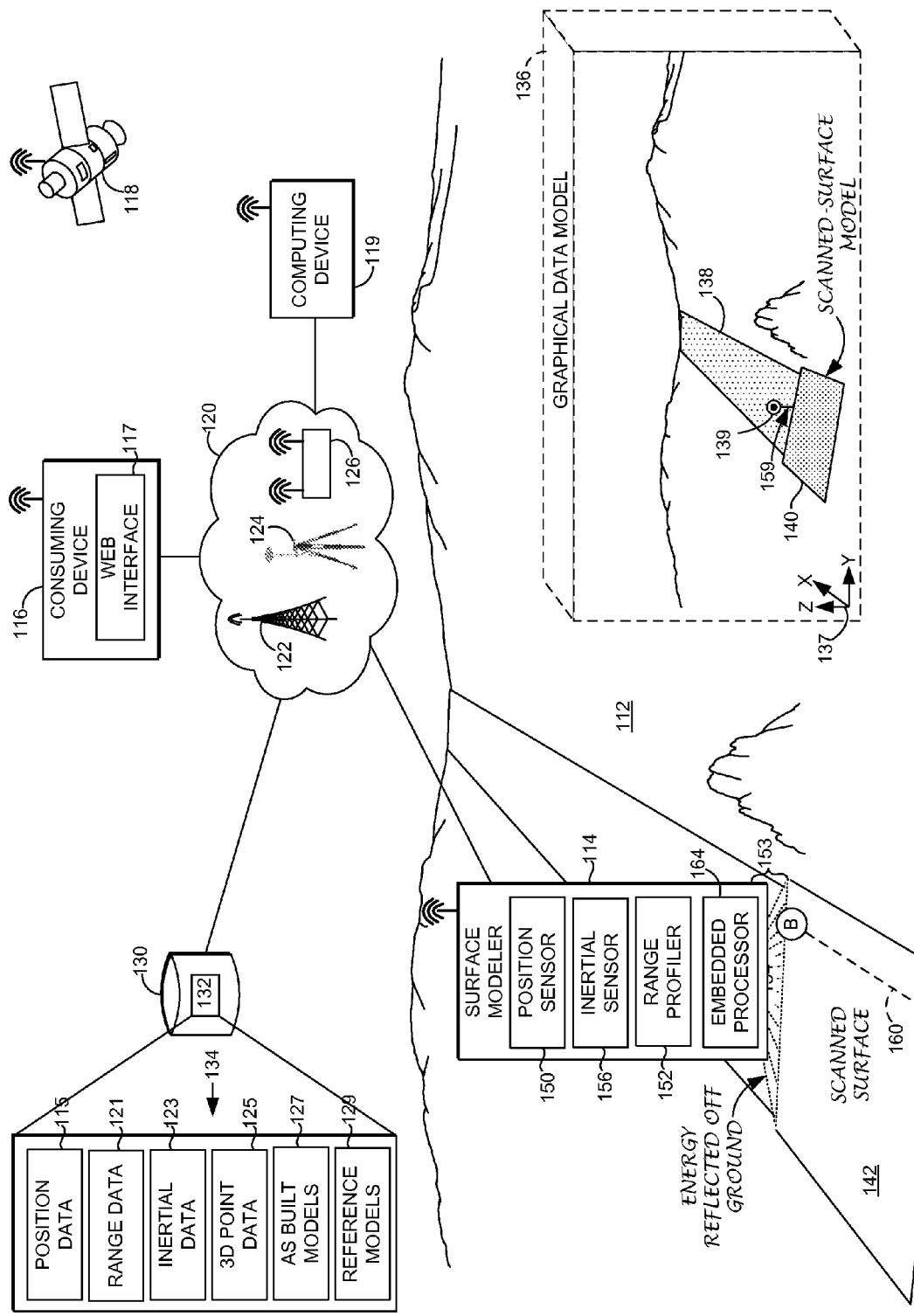
FIG. 1 depicts a schematic diagram of an exemplary system in accordance with an embodiment of the present invention.

Referring to FIG. 1, an exemplary environment 110 is depicted in which an embodiment of the present invention may be practiced. FIG. 1 includes various elements, such as ground surface 112. In addition, FIG. 1 includes a surface modeler 114, consuming device 116, satellite system 118, and computing device 119. Network 120 is also depicted that facilitates communication among the various devices.

FIG. 1 also depicts a data store 130 that stores information 132. Information 132 is depicted in an exploded view 134 to include various categories of information, and information maintained in data store 130 is generated by various elements of environment 110. For example, information might be generated by surface modeler 114, computing device 119, consuming device 117, or satellite system 118 and communicated to the data store 130 to be stored. Data store 130 is depicted as an element of network 120; however, it should be understood that data store 130 could also be maintained locally on one of the other components of FIG. 1, such as on surface modeler 114.

One category of information 132 includes position data 115, which describes historical and current positions of various elements in FIG. 1, such as surface modeler 114, tower 122, station 124, and satellite system 118. Other exemplary categories of information include range data 121, which is generate by and received from range profiler 152, and inertial data 123, which is generated by and received from inertial sensor 156. In addition, data store 130 includes 3D point data 125, as-built models 127, and reference models 129.

In an embodiment of the present invention, a model 136 is created of an environment in which surface modeler 114 is positioned. The model 136 is generated using various data retrieved from data store 130 or obtained directly from surface modeler 114. For example the model 136 might be created using one of the reference models 129 in data store 130 and another model of a scanned surface 112 generated by surface modeler 114. As such, the model 136 might be generated by software running on a processor 164 of surface modeler 114, computing device 119, consuming device 116, or a combination thereof.

Model 136 is an integrated data model compiled from various sources that includes model 138 of a reference surface (i.e., reference-surface model). Pursuant to an embodiment of the present invention, surface modeler 114 generates a model 140 from a scanned surface 142 that may be compared to the reference-surface model 138.

Although for illustrative purposes FIG. 1 depicts graphical models, other types of models may also be generated, analyzed, and compared, such as various types of mathematical models, coordinate frames, and the like. Moreover, model 136 may comprise different versions of the same site that are observed by surface modeler 114 at different instances in time. For example, one type of model may represent only a proposed model coincident with the surface modeler 114 location, whereas another type of model 136 may also represent an updated version that has been supplemented to include a model 140 of scanned surface 142. Generation of scanned-surface model 140 is described in more detail below.

Network 120 is depicted as a single cloud, but in reality, network 120 may include multiple networks that facilitate communication among the elements of FIG. 1 (e.g., between surface modeler 114 and consuming device 116). For example, network 120 is illustrated to include a communications tower 122, which may provide cellular data services with which elements communicate. Network 120 is also illustrated to include a Global Navigation Satellite System (GNSS) station 124, which may provide related communications and may be identified as a location-determining service. Moreover, network 120 may include a network router 126 or other device that facilitates Wi-Fi or other wireless communication. Components depicted in FIG. 1, may also communicate directly between one another using two-way-radio technology.

Elements depicted in FIG. 1 may communicate with one another in various circumstances. For example, satellite system 118 might transmit real-world-position information to elements depicted in FIG. 1 or transmit information that enables calculation of a real-world position. Real-world-position information may include various information that describe an object's position relative to the Earth. For example, real-world-position information may include a latitude measurement and a longitude measurement that describes a position on the earth's surface. Moreover, real-world-position information may include a vertical position or altitude above a reference datum. In one embodiment, real-world-position information includes a World Geodetic System (WGS) position. As such, a WGS position may describe a position of surface modeler 114 on Earth. Satellite system 118 may transmit other information, such as universal-time data, which may be used to sync operations among various components of FIG. 1.

In one embodiment, satellite system 118 communicates directly with position sensor 150 integrated with surface modeler 114 to record real-world-position information describing the position of surface modeler 114. As such, position sensor 150 may include various technologies and components, such as a GPS receiver. In addition, satellite system 118 may communicate with reference station 124 and position sensor 150 in order to calculate position information of surface modeler 114. For example, a real-time location system or Real Time Kinematic (RTK) system may be employed in environment 110 to determine positions of the various elements (e.g., surface modeler 114). In such an embodiment, a real-world position of reference station 124 may be determined and used as a reference point, which is broadcast to other elements in environment 110. The relative position of these other elements may then be based on the real-world position of reference station 124. Regardless of what technique is used to determine a surface-modeler position, in one embodiment the position is time stamped based on a universal time-reference system.

In other embodiments of the present invention, surface modeler 114 communicates with a consuming device 116. For example, surface modeler 114 may determine a model of surface 112 and transmit the model to consuming device 116 or to computing device 119. In addition, consuming device 116 may analyze the model and generate surface-related information that is communicated to surface modeler and/or to computing device 119.

In a further embodiment of the present invention, surface modeler 114 converts the surface-modeler position to a model frame coordinate of a version of model 136, which represents the environment in which surface modeler 114 is located. That is, surface modeler 114 stores model 136, such as in computer storage media, and model 136 includes a coordinate frame definition, which is represented by reference axis 137. As such, a coordinate transformation process may be applied to the surface-modeler position to convert the position to a model coordinate.

When the surface-modeler position includes a real-world position of surface modeler 114, conversion may be based on a known real-world reference points that are also included in model 136 and that has already been converted. Alternatively, when the surface-modeler position is relative to reference station 124, which includes a known reference position, the received surface-modeler position may already be converted to a coordinate of model 136. For illustrative purpose, point 139 is depicted in model 136 and represents a surface-modeler model coordinate that has been derived from a position of surface modeler.

In addition, surface modeler 114 includes range profiler 152, which samples distances 153 between scanned surface 142 and range profiler 152. For example, range profiler 152 may employ various technologies that emit energy 154 from the profiler that is reflected off of the scanned surface and that is sensed by the range profiler 152. Based on the sensed energy 154, the range profiler 152 calculates sampled distances 153 between the scanned surface and the profiler. Various distance-detection technologies may be employed. In an embodiment of the present invention, range profiler 152 utilizes light detection and ranging (LIDAR) technology. Moreover, the distance measurements may be time stamped based on a universal time-reference system.

In a further embodiment, range profiler 152 is configurable to filter the amount of distance information. For example, range profiler 152 may be configured to capture distance information at specified time intervals (e.g., 1000 samples every second). In addition range filtering methods may be specified to qualify which samples are to be utilized (e.g., all measured ranges within 20 meters).

Surface modeler 114 further includes an inertial sensor 156, which captures inertia measurements based on various detected and measured movement types. For example, an inertial sensor 156 may include a multi-axis accelerometer that detects velocity changes. In addition, inertia sensor 156 may include multi-axis gyroscope that detects rotational rates. An exemplary inertial sensor is an inertial measurement unit (IMU) which integrates the various components to measure a variety of movement types. As such, inertial sensor 156 may detect, measure, and record movements of surface modeler 114 that may be time stamped based on a universal time-reference system.

Once surface modeler 114 has received or captured the surface-modeler position, the surface distances, and the inertial measurements, a portion of the scanned surface can be modeled. For example, as indicated above, these information items (i.e., position, distances, and inertial measurements) are all time stamped based on a universal time-reference system. As such, the information items can all be matched up and correlated. Based on the correlation of timestamps, surface modeler 114 can determine that, when the modeler 114 was positioned at a received model coordinate (e.g., 139), the scanned surface was a measured distance away (e.g., 153). The measured distance (e.g., 153) can be projected, based on the inertial measurements (e.g., rotational movement) and can then be converted to a scanned-surface model coordinate. That is, the measured distance can be converted to a scanned-surface model coordinate based on the modeler model coordinate. For illustrative purposes, model 136 includes line 159 that represents distance 153. Although line 159 would not actually be modeled, line 159 illustrates that the scanned-surface model can be derived in model 136 based on the distance 153.

In an embodiment of the present invention, surface modeler 114 is traversed across a surface 112. For example, surface modeler 114 may be attached to, or carried by, a person walking or otherwise moving across surface 112. In addition, surface modeler 114 may be attached to a vehicle, such as a car, truck, sports-utility vehicle, all-terrain vehicle, construction-equipment vehicle, etc. FIG. 1 depicts a first point "A" and a second point "B." A dashed line 160 that connects the first point to the second point illustrates a movement of surface modeler 114 relative to surface 112.

A position history of surface modeler 114 may be logged using various techniques as the surface modeler is traversed across surface 112. For example, position sensor 150 may continue to receive modeler positions (i.e., from satellite system 118 or reference station 124) as surface modeler traverses surface 112. In addition, inertial measurements (e.g., acceleration and rotation rates) may be combined with an initial starting position (e.g., received from satellite system 118 or reference station 124) and directional measurements (e.g., range, elevation and angle) to track a traversal of surface modeler 114.

In one embodiment, surface modeler 114 may be programmed to automatically transmit scanned-surface-model information in near real time, as the information is collected. In addition, surface modeler 114 may be programmed to automatically send scanned-surface-model information in intervals, such as time intervals (e.g., every 60 seconds) or distance intervals (e.g., every 100 yards). Moreover, surface modeler 114 may be programmed to refrain from sending the scanned-surface model 140 until the information is requested (e.g., from consuming device 116) or until the modeler 114 receives an input instructing it to transmit model 140.

Scanned-surface model 140 may be analyzed in various manners. In one embodiment scanned-surface model 140 may be compared to another surface model 138 to determine similarities and/or differences. The other surface model may represent various surfaces. For example, surface model 138 may include a theoretical surface that is designed as part of a construction-design process. Accordingly, comparing scanned-surface model 140 to a theoretical model may assist with determining whether scanned surface is graded consistent with a construction design. Another example of surface model 138 includes a previously created model of scanned surface 112, such that a comparison may reveal changes in time experienced by surface 112.

In one embodiment, surface modeler 114 executes a differential analysis between scanned-surface model 140 and reference-surface model 138. FIG. 1 depicts that surface modeler 114 includes an embedded processor 164, which may apply various analysis techniques. For example, embedded processor 164 may generate differential information that indicates a difference between a model depth and/or model grade of scanned-surface model 140 and a model depth and/or model grade of reference-surface model 138. In one embodiment the differential information may be formatted to present an isopach map, which illustrates depth differences between the scanned-surface model and the reference-surface model.

In a further embodiment, the differential analysis may trigger subsequent alerts or responses. For example, an alert or notification may be programmed to be released when a difference between two models satisfies a threshold requirement (e.g., difference is greater than a threshold value or difference is less than a threshold value).

However, surface modeler 114 may also transmit scanned-surface model 140 to other computing devices, such as consuming device 116, which carries out various analyses of scanned-surface model 140. For example, surface modeler 114 may leverage one or more of the components of network 120, such as a cellular-data-service connection or a router. Consuming device 116 might also perform functions similar to those described above with respect to analyzing model 136. For example, consuming device 116 may compare the model of the scanned surface to another model to determine an extent to which the models are consistent and different. Moreover, consuming device 116 may also transmit alerts and notifications that result from the differential analysis. In a further embodiment, consuming device 116 includes a web interface 117 to enable web-based information retrieval and submission by consuming device 116.

Figure 2:
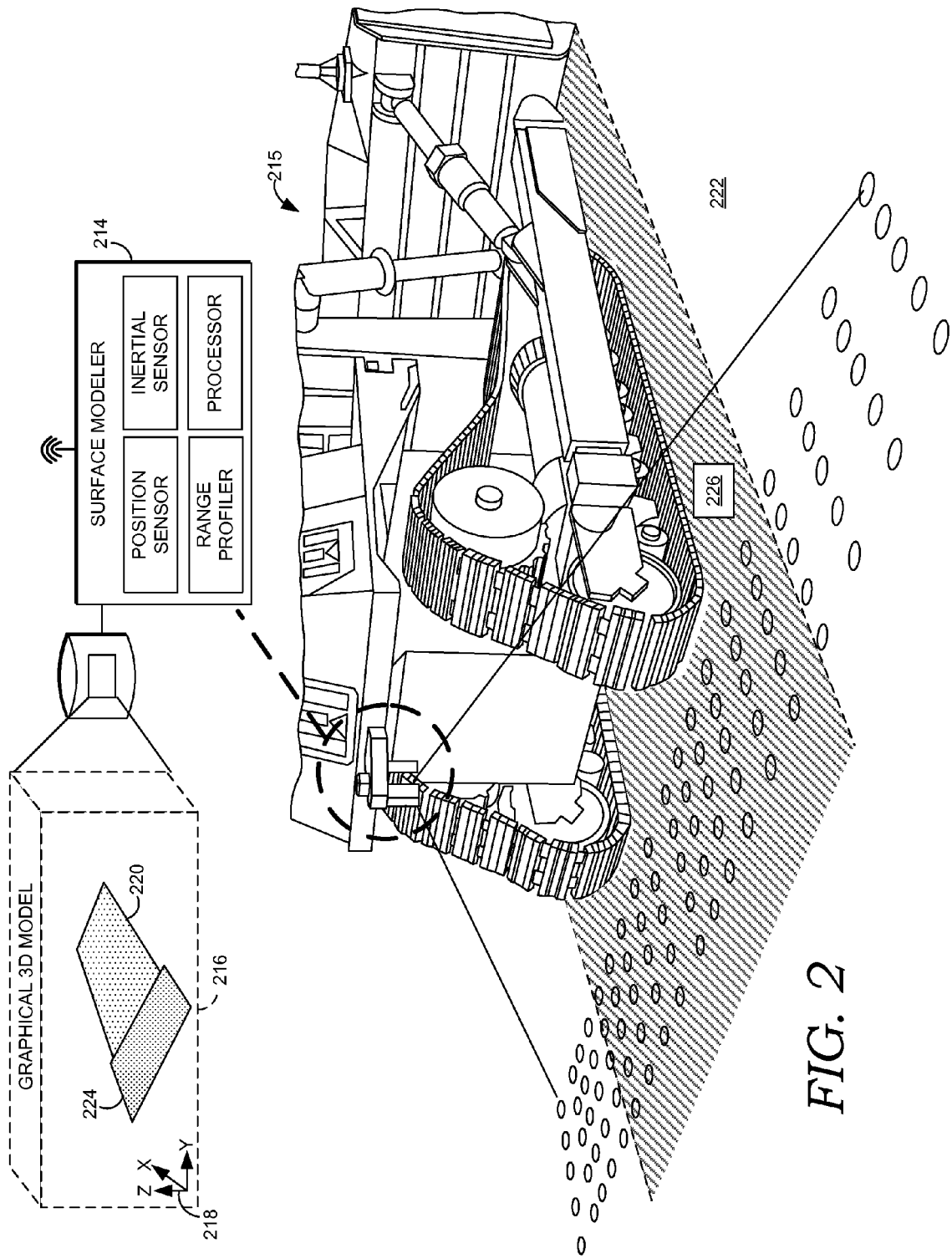
FIG. 2 depicts an exemplary operating environment in accordance with an embodiment of the present invention.

Referring now to FIG. 2, another embodiment of the present invention is depicted in which a surface modeler 214 is affixed to a piece of earth-moving construction equipment 215 (hereinafter "grader"), which may be used to complete various tasks related to a construction project. Although FIG. 2 depicts a grader, surface modeler 214 could also be affixed to other types of vehicles at a construction project, such as a truck or all-terrain vehicle. Alternatively, surface modeler 214 could also be a handheld device.

Often, a construction project will be associated with a 3D design model, which specifies various plan details associated with the construction project. As such, FIG. 2 depicts an exemplary 3D design model 216 that may be stored in computer storage media of surface modeler 214. Similar to model 136 described in FIG. 1, 3D design model 216 includes a coordinate system 218 defining model coordinates within the 3D design model.

Among other things, the 3D design model 216 may specify a grade (e.g., desired theoretical grade or previously measured grade) of a particular surface 222. By specifying the grade in the design model, a reference-surface model 220 is created (similar to reference-surface model 138 described in FIG. 1) that can be compared to a scanned-surface model 224.

In one embodiment of the present invention, surface modeler 214 may be employed as grader 215 completes a pass along a surface 222 to create a scanned-surface model 224 of the graded surface 226. That is, by receiving and combining model coordinates of surface modeler 214, detected distances between surface modeler and graded surface 226, and inertial measurements, surface modeler 214 may generate scanned-surface model 224.

Scanned-surface model 224 may be processed and analyzed in various manners. For example, scanned-surface model 224 may be transmitted to a consuming device (not depicted) in a construction-site field office or other computing devices that would benefit by receiving the grade of graded surface 226. In addition, the scanned surface model 224 may be compared to the design-model grade 220 to determine whether the graded surface 226 is consistent with the design model or whether additional work is required (e.g., additional grading or additional material). As such, a differential analysis may be performed between scanned-surface model 224 and reference-surface model 220. In one embodiment, a result of the differential analysis is an isopach image depicting differences in depth using a color-coding scheme. As previously described, the differential analysis may be performed by the surface modeler 214 or by a consuming device that receives the scanned-surface model 224.

In a further embodiment, a comparison between scanned-surface model 224 and reference-surface model 220 may cause a notification or alarm to be transmitted. For example, if the comparison between the scanned-surface model 224 and the reference-surface model reveals that the graded surface is too shallow or too deep, an alarm may be triggered notifying an operator that additional action is necessary. A "too shallow" or "too deep" determination may be made using a threshold differential, such as when the scanned-surface model 224 appears to be more than a threshold distance (e.g., three inches) shallower or deeper than the reference-surface model 220.

In embodiments of the present invention differential analysis that triggers the alarm or notification may be provided by the surface modeler 214 or by another consuming device (e.g., field-office computing device). Moreover, the alarm or notification may be sent to a variety of consuming devices. For example, a notification or alarm may be presented on a computing device in the field office that is monitored by an engineer or by other personnel. In addition, a notification or alarm could be presented to the grader operator to provide immediate feedback that he or she is grading too shallow or too deep.

In an embodiment of the present invention, the elements of FIG. 2 provide real time, or near real time, surface-grade information to consuming devices. As such, the elements of FIG. 2 may be modified from those traditionally employed with mobile mapping systems that are used for mapping and topographic surveys. That is, the surface modeler 214 executes various computations, such as receiving information from the position sensor, the inertial sensor, and the range profiler, as well as correlating the received information to create a surface model. The size of this information can be relatively large, such that processing may be computationally intensive, thereby making real time (or near real time) transmission challenging, if certain parameters and elements are not controlled or optimized.

The elements of FIG. 2 may be configured or selected in various ways to be most conducive to providing surface-grade information in real time, or near real time. For example, reliance on inertial information for position tracking may generate large collections of data requiring heavy algorithms to solve for a surface-modeler position. As such, the elements of FIG. 2 may be configured to rely on sensor position information in order to track a position of surface modeler, as opposed to calculating position based on inertial measurements. This is in contrast to other mobile mapping systems, which rely on inertial measuring systems.

The amount of information collected and/or processed by surface modeler 214 may be controlled using additional methods. For example, mobile-mapping systems are often designed to collect as much information as possible, in order to provide a most complete 3D representation. However, the amount of information collected by these systems is unnecessary for grade checking and renders real time, or near real time, checking infeasible. However, the components of surface modeler 214 can be configured to collect less data, which is conducive to the real-time and near-real-time computations. In addition, surface modeler 214 may be constructed with lower-precision components that provide a sufficient amount of information to accurately determine position/orientation and that are appropriate for construction-grade checking.

In accordance with an embodiment of the present invention, a surface modeler 114 is constructed based on an assumption that measurement durations are relatively short in duration and will have minimal interruptions. As such, inertial sensors might be selected that have lower degrees of system stability. In this regard, the surface modeler 114 is not limited to a high end fiber optic gyroscope or a ring laser gyroscope, which are relatively stable with time in order to sustain long measurement periods without real-world position measurements.

In addition, a surface modeler 114 built in accordance with an embodiment of the present invention might include any distance sensor having an accessible control interface that allows for configuration and logging of data. As such, the surface modeler 114 is not limited to a purpose built distance sensor. Moreover, the surface modeler 114 is configurable to determine as subset of observations for processing—not all observations are required to be processed into mapped coordinates.

In a further aspect, the surface modeler 114 uses any device or system that can measure position history in model coordinates, such as GNSS, Robotic Total Stations, and fan beam laser levels. In addition, operations of the surface modeler 114 might be carried out using an independent time source as the primary means of synchronizing the various components. As such, the time system of the surface modeler 114 is indexable to a universal time system, such as UTC, using means of various available time services. As such, the surface modeler 114 is not limited to GNSS.

Various aspects of the present invention that have been described may be embodied as, among other things: a method, system, or set of instructions embodied on one or more computer-readable media. For example, steps or processes described in FIGS. 1 and 2 may be instructions embodied on computer-readable media. Computer-readable media include both volatile and nonvolatile media, removable and non-removable media, and contemplate media readable by a database, a switch, and various other network devices. Computer-readable media include media implemented in any way for storing information. Examples of stored information include computer-useable instructions, data structures, program modules, and other data representations. Media examples include RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data momentarily, temporarily, or permanently.

Figure 3:
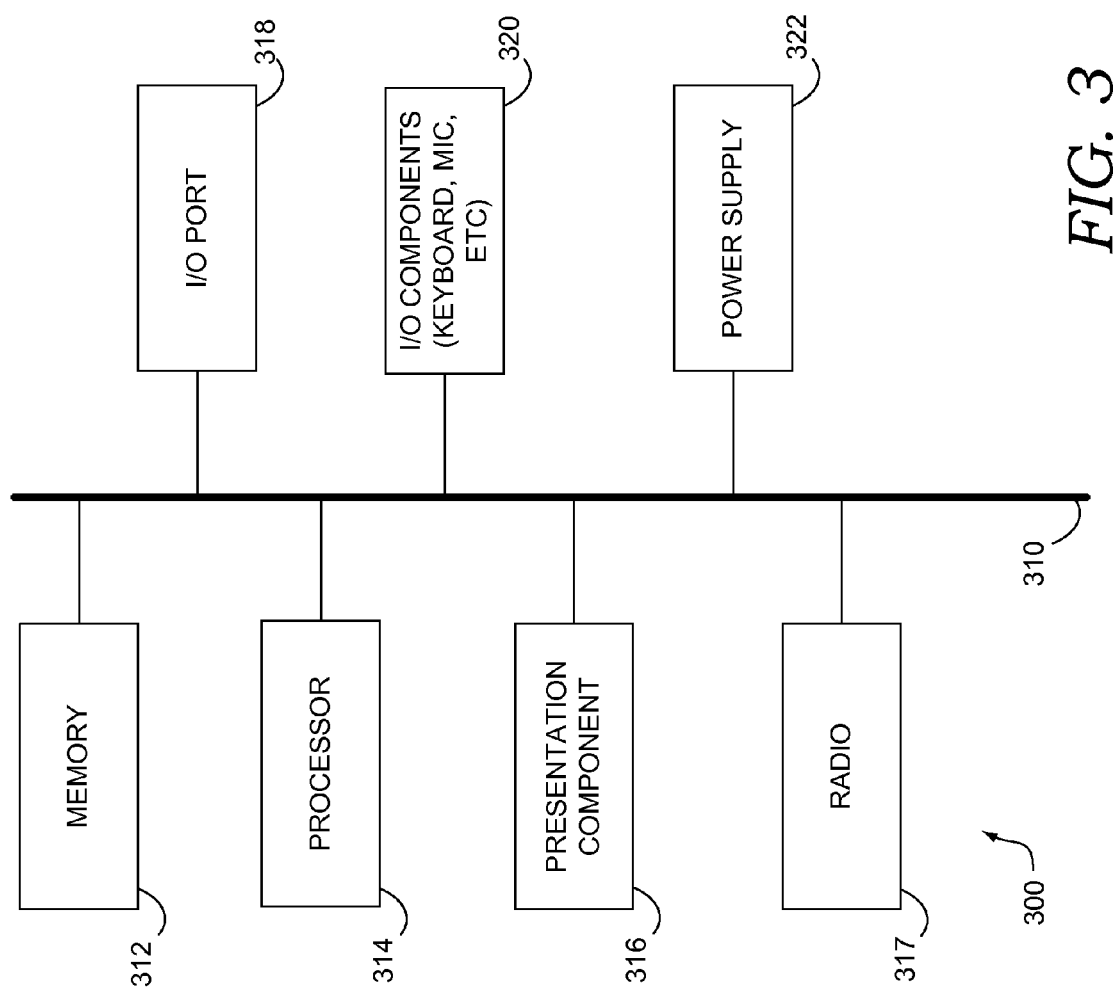
FIG. 3 depicts a schematic diagram of an exemplary computing device in accordance with an embodiment of the present invention.

Referring now to FIG. 3, an exemplary computing device 300 is depicted in accordance with an embodiment of the present invention. For example, at least part of device 300 may comprise surface modeler 114 and 214. Although some components are shown in the singular, they may be plural. For example, device 300 might include multiple processors or multiple radios, etc. As illustratively shown, device 300 includes a bus 310 that directly or indirectly couples various components together including memory 312, a processor 314, a presentation component 316, a radio 317, input/output ports 318, input/output components 320, and a power supply 322.

Memory 312 might take the form of one or more of the aforementioned media. Thus, we will not elaborate more here, only to say that memory component 312 can include any type of medium that is capable of storing information in a manner readable by a computing device. In one embodiment memory includes a computer-readable memory device. Processor 314 might actually be multiple processors that receive instructions and process them accordingly. Presentation component 316 includes the likes of a display, a speaker, as well as other components that can present information (such as a lamp (LED), or even lighted keyboards).

Radio 317 represents a radio that facilitates communication with a wireless telecommunications network. Illustrative wireless telecommunications technologies include CDMA, GPRS, TDMA, GSM, and the like. In some embodiments, radio 317 might also facilitate other types of wireless communications including Wi-Fi communications and GNSS communications.

Input/output port 318 might take on a variety of forms. Illustrative input/output ports include a USB jack, stereo jack, infrared port, proprietary communications ports, and the like. Input/output components 320 include items such as keyboards, microphones, touch screens, and any other item usable to directly or indirectly input data into device 300. Power supply 322 includes items such as batteries, fuel cells, or any other component that can act as a power source to power mobile device 300.

Figure 4:
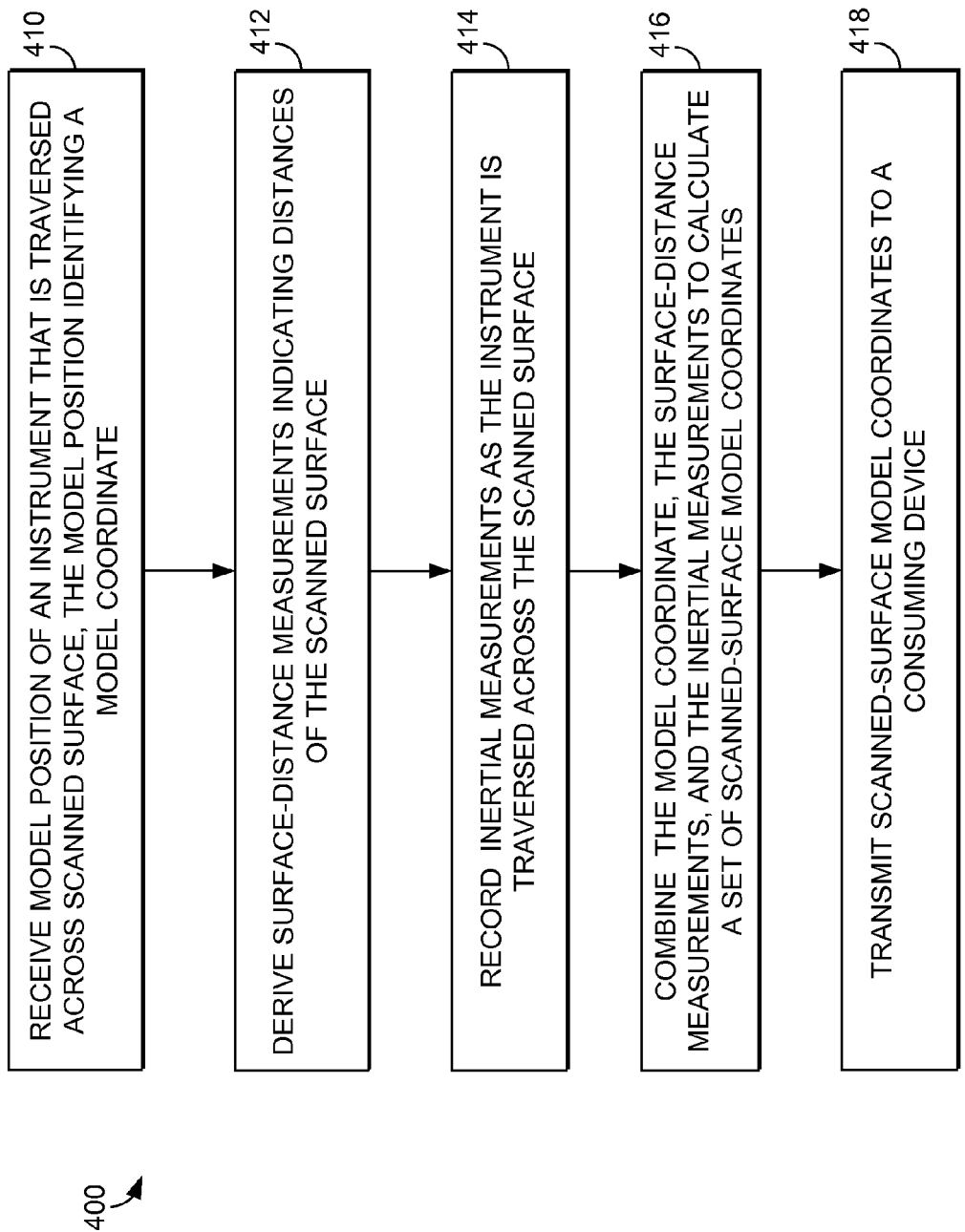
FIG. 4 depicts a flow diagram that outlines an exemplary method in accordance with an embodiment of the present invention.

Turning now to FIG. 4, a flow diagram is depicted that illustrates an exemplary method 400 in accordance with an embodiment of the present invention. When describing method 400 herein, reference may also be made to FIGS. 1-3. Method 400 relates to generating a scanned-surface model (e.g., 136b) that represents a scanned surface (e.g., 112), and method 400 may be carried out in various contexts. For example, computer-readable media may store computer-executable instructions that, when executed by a computing device facilitate or perform one or more steps of method 400.

At step 410, method 400 includes receiving a model frame position of an instrument that is traversed across the scanned surface, wherein the model position identifies a model coordinate of a 3D model and represents a position of the instrument in the 3D model. For example, model position 139 of surface modeler 114 may be received, and surface modeler 114 is an exemplary instrument that may be traversed across surface 112. Moreover, model position 139 identifies a model coordinate within 3D model 136 and represents a position of surface modeler 114 in 3D model 136. Modeler 114 may be traversed across surface 112 in various contexts. For example, modeler 114 may comprise a hand-held unit or other mobile device that is maintained on a person, who traverses surface 112. In addition, modeler 114 may be attached to a vehicle, such as the grader depicted in FIG. 2.

Step 412 includes deriving, by a range profiler, a set of surface-distance measurements indicating distances of the scanned surface away from the range profiler, wherein the surface-distance measurements are derived as the instrument is traversed across the scanned surface. For example, range profiler 152 derives a set of distances (e.g., 153) that indicate a distance of scanned surface 142 away from range profiler 152. Moreover, distances may be captured as modeler 114 is traversed across surface 112. Also, as depicted by line 159, detected distances may be converted to model-relevant information.

At step 414, an inertial sensor records a set of inertial measurements as the instrument is traversed across the scanned surface. For example, inertial sensor 156 may record inertia measurements (e.g., velocity rates, rotation rates, and the like) as modeler 114 is traversed across surface 112.

Step 416 includes combining the model coordinate, the set of surface-distance measurements, and the set of inertial measurements to calculate a set of scanned-surface model coordinates, wherein the scanned-surface model coordinates represent the scanned surface in the 3D model. For example, time stamps may be used to correlate model coordinates (e.g., 139), surface-distance measurements (e.g., 153 and model-converted data 159), and inertial measurements, in order to determine coordinates comprising scanned-surface model 140. That is, although scanned-surface model 140 is depicted as a plane for illustrative purposes, model 140 comprises a series of model coordinates that when combined make up a model of scanned surface 142.

At step 418, the scanned-surface model coordinates are transmitted to a consuming device. For example, FIG. 1 depicts surface modeler 114 transmitting data 170, which may be addressed to consuming device 116 or to another computing device 119. As described above, data 170 may be transmitted in real time as surface-model information is generated. In addition, data 170 may be transmitted at specified intervals, such as when an interval threshold is satisfied. Exemplary interval thresholds include an amount of time during which the surface is traversed and a distance along which the surface is traversed.

An embodiment of the present invention may be used in various manners. For example, a surface modeler may be used to reduce the need for personnel in the field collecting data and repurpose them to reviewing the data and analyzing survey results. Additionally, an embodiment of the present invention could potentially automate the development of as-built documents required for payment which would save additional time and improve cash flow for contractors. As contractors and engineers create more 3D models to drive machine-guidance systems, there is an opportunity to automate the process to check the results and verify that the work is complete and within tolerance. If this can be done in real time or near real time—by pushing the data from the surface modeler back into the software systems used to create the model, there is a closure to the data flow in an automated fashion.

Many different arrangements of the various components depicted, as well as components not shown, are possible without departing from the scope of the claims below. Embodiments of our technology have been described with the intent to be illustrative rather than restrictive. Alternative embodiments will become apparent to readers of this disclosure after and because of reading it. Alternative means of implementing the aforementioned can be completed without departing from the scope of the claims below. Certain features and subcombinations are of utility and may be employed without reference to other features and subcombinations and are contemplated within the scope of the claims.

The invention claimed is:

1. Computer storage media storing computer-executable instructions thereon that, when executed, perform a method of generating a scanned-surface model that represents a scanned surface, the method comprising:
    receiving a model position of an instrument that is traversed across the scanned surface, wherein the model position identifies a model coordinate of a three-dimensional (3D) model and represents a position of the instrument in the 3D model;
    deriving, by a range profiler, a set of surface-distance measurements indicating distances of the scanned surface away from the range profiler, wherein the surface-distance measurements are derived as the instrument is traversed across the scanned surface;
    recording, by an inertial sensor, a set of inertial measurements as the instrument is traversed across the scanned surface;
    combining the model coordinate, the set of surface-distance measurements, and the set of inertial measurements to calculate a set of scanned-surface model coordinates, wherein the scanned-surface model coordinates represent the scanned surface in the 3D model; and
    transmitting the scanned-surface model coordinates to a consuming device.

2. The media of claim 1,
    wherein receiving the model position includes receiving a relative position from a reference station,
    wherein a real-world position of the reference station is known and has been converted to the 3D model as a reference-station model position, and
    wherein the relative position is based on the reference station model position.

3. The media of claim 1, wherein receiving the model position includes receiving a real-world position of the instrument, and wherein the real-world position is converted to the model position based on a known reference position.

4. The media of claim 1, wherein the model coordinate, the set of surface-distance measurements, and the set of inertial measurements are all time stamped in accordance with a universal time-reference system.

5. The media of claim 4, wherein the combining includes coordinating respective time stamps of the model coordinate, the set of surface-distance measurements, and the set of inertial measurements.

6. The media of claim 1 wherein the model coordinate is received by a position sensor positioned a known distance apart from the range profiler, and wherein the method further comprises calibrating the set of surface-distance measurements based on the known distance.

7. The media of claim 1, wherein the distances of the scanned surface away from the range profiler are calculated based on energy that reflects off the ground surface.

8. The media of claim 7, wherein the sensor utilizes light detection and ranging (LIDAR) technology.

9. The media of claim 1 further comprising, generating surface-differential information by comparing the scanned-surface model coordinates to other-surface model coordinates representing another surface, the surface-differential information indicating a difference between the scanned-surface model coordinates and the other-surface model coordinates.

10. The media of claim 9, wherein the surface-differential information is transmitted to the consuming device.

11. The media of claim 10, wherein the other surface is a theoretical design surface.

12. The media of claim 10, wherein the other surface is a previously scanned surface.

13. The media of claim 1 further comprising, configuring the range profiler to derive surface-distance measurements at a reduced rate by filtering range-profiler measurements by user-define parameters.

14. The media of claim 13, wherein the user defined parameters include maximum sample spacing, maximum surface deviation triggers, maximum range from sensor, or a combination thereof.

15. The media of claim 1, wherein the scanned-surface model coordinates are transmitted at a programmed interval, which includes a distance traversed across the scanned surface.

16. A method of generating a scanned-surface model that represents a scanned surface, the method comprising:
receiving model positions of an instrument that is mounted to a motorized vehicle traversing the scanned surface, wherein the model positions identify model coordinates of a three-dimensional (3D) model and represent positions of the instrument in the 3D model;
deriving, by a range profiler, a set of surface-distance measurements indicating distances of the scanned surface away from the range profiler, wherein the set of surface-distance measurements are derived as the motorized vehicle traverses the scanned surface and wherein the scanned surface has been graded by the motorized vehicle;
recording, by an inertial sensor, a set of inertial measurements as the motorized vehicle traverses the scanned surface;
combining the model coordinates, the set of surface-distance measurements, and the set of inertial measurements to calculate a set of scanned-surface model coordinates, wherein the scanned-surface model coordinates represent the scanned surface, which has been graded, in the 3D model;
determining that an interval-unit threshold has been met while the motorized vehicle traverses the scanned surface; and
transmitting the scanned-surface model coordinates to a consuming device when the interval-unit threshold is satisfied.

17. The method of claim 16 further comprising generating surface-differential information by comparing the scanned-surface model coordinates to other-surface model coordinates representing another surface, the surface-differential information indicating a difference between the scanned-surface model coordinates and the other-surface model coordinates.

18. The method of claim 16, wherein the other surface is a theoretical design surface specified in a construction design model, which provides plan details related to a construction environment in which the motorized vehicle is operating.

19. The method of claim 16, wherein the programmed interval includes a distance traversed by the motorized vehicle.

20. A surface-modeling device, including a processor and a computer storage medium, that performs a method of generating a scanned-surface model that represents a scanned surface, the surface-modeling device comprising:
a position sensor programmed to determine a model position of the surface-modeling device, wherein the model position identifies a model coordinate of a three-dimensional (3D) model and represents a position of the surface-modeling device in the 3D model;
a range profiler programmed to derive a set of surface-distance measurements indicating distances of the scanned surface away from the range profiler;
an inertial sensor for recording a set of inertial measurements;
the processor that is programmed to combine the model coordinate, the set of surface-distance measurements, and the set of inertial measurements to calculate a set of scanned-surface model coordinates, wherein the scanned-surface model coordinates represent the scanned surface in the 3D model; and
a transceiver for transmitting the scanned-surface model coordinates to a consuming device.

\* \* \* \* \*